United States Patent [19]
Delorme

[11] Patent Number: 5,838,714
[45] Date of Patent: *Nov. 17, 1998

[54] TUNABLE WAVELENGTH LASER EMISSION COMPONENTS

[75] Inventor: Franck Delorme, Villejuif, France

[73] Assignee: France Telecom, France

[ * ] Notice: This patent issued on a continued prosecution application filed under 37 CFR 1.53(d), and is subject to the twenty year patent term provisions of 35 U.S.C. 154(a)(2).

[21] Appl. No.: 695,988

[22] Filed: Aug. 15, 1996

[30] Foreign Application Priority Data

Aug. 18, 1995 [FR] France .................................. 9509915

[51] Int. Cl.$^6$ .............................. H01S 3/08; H01S 3/10; H01S 3/19
[52] U.S. Cl. .................................. 372/96; 372/20; 372/50
[58] Field of Search .................. 372/96, 26, 28, 372/20, 92, 102, 50, 43–46

[56] References Cited

U.S. PATENT DOCUMENTS

| 4,885,753 | 12/1989 | Okai et al. | 372/45 |
| 5,379,318 | 1/1995 | Weber | 372/96 |
| 5,394,260 | 2/1995 | Suzuki et al. | 372/26 |
| 5,495,360 | 2/1996 | Yoo | 372/45 |

FOREIGN PATENT DOCUMENTS

| A-0 391 334 | 4/1990 | European Pat. Off. | H01S 3/103 |
| 93 14588 | 12/1993 | France . | |

OTHER PUBLICATIONS

IEEE Photonics Technology Letters, vol. 7, no. 3, 1 Mar. 1995, New York, US, pp. 269–271.

Electronics Letters, 4th Aug. 1994, vol. 30, no. 16, pp. 1347–1348.

Electronics Letters, 7th Jan. 1993, vol. 29, no. 1, pp. 41–42.

IEE Proceedings, J, vol. 138, no. 2, Apr. 1991, pp. 171–177.

IEEE Journal of Quantum Electronics, vol. 29, no. 6, 1 Jun. 1993, New York, US, pp. 1817–1823.

IEEE Photonics Technology Letters, vol. 5, no. 2, Feb. 1993, pp. 126–129.

*Primary Examiner*—Rodney B. Bovernick
*Assistant Examiner*—Quyen Phan Leung
*Attorney, Agent, or Firm*—Blakely Sokoloff Taylor & Zafman

[57] ABSTRACT

A wavelength tunable laser emission component includes on the same substrate an active emission section and a Bragg section that includes a waveguide in which is formed a plurality of individual Bragg gratings corresponding to particular Bragg wavelengths. The waveguide has an electro-absorbent structure, the subsections of the Bragg section each being voltage-controlled. The laser emission wavelength is tuned to one or other of the Bragg wavelengths of these subsections according to control voltages applied thereto.

12 Claims, 1 Drawing Sheet

TUNABLE WAVELENGTH LASER EMISSION COMPONENTS

BACKGROUND OF THE INVENTION

1. Field of the invention

The present invention concerns tunable wavelength laser emission components.

In particular it proposes a single-frequency laser that can be tuned very quickly and across a very wide range.

The invention finds advantageous applications in fiber optic transmission and optical switching.

2. Description of the prior art

Various tunable wavelength single-frequency semiconductor laser structures have been proposed and constructed.

The distributed Bragg reflector (DBR) structure allows discontinuous tuning, i.e. tuning in discrete steps, over a bandwidth of 10 nm. Reference may usefully be had to:

[1] Y. KOTAKI et al.: "Wavelength tunable DFB and DBR lasers for coherent optical fiber communications", IEEE Proceedings-J, Vol. 138, N°2, April 1991.

A structure of this kind comprises an active section (amplifying part) coupled to a passive guide section in which the Bragg grating which enables the single-frequency emission is etched. The tunability of this laser results from injection of current into the Bragg section: the variation in the number of carriers contributes to modification of the index of the area and thus of the Bragg wavelength of the laser.

In this type of laser the best measured time to switch between two successive wavelengths (0.5 nm) is equal to 500 ps. This switching time is limited by the lifetime of the carriers in the grating section ($\cong 1$ ns) and increases with the wavelength excursion: it is typically 10–15 ns for an excursion of 3 nm. This phenomenon has been described in, for example:

[2] F. DELORME et al.: "Fast tunable 1.5 $\mu$m distributed Bragg reflector laser for optical switching applications", Electron. Lett., Vol. 29, N°1, January 1993.

Furthermore, this structure does not provide switching times compatible with the duration of a bit period of modulation at 10 Gbit/s (which would require switching times in the order of 50 ps).

To obtain very short wavelength switching times a DBR laser structure using the Franz-Keldysh electro-optical effect has recently been proposed in:

[3] F. DELORME et al.: "Ultra-Fast Optical Switching Operation of DBR Lasers Using an Electro-Optical Tuning Section", IEEE Photonics Techn. Lett., Vol. 7, N°3, March 1995.

Switching times of 500 ps independent of the wavelength excursion have been measured on this structure. However, the disadvantage of this structure is the limited tunability available from the electro-optical effect, due to the small variation of index that can be achieved by this means: 1.5 nm to 2.5 nm only with six different modes.

Furthermore, the control voltage required to achieve this tunability is high (5–6 V). In particular, it has only been possible to measure the switching time between four different modes, because of the high voltages to be applied to the Bragg section to obtain the change of wavelength.

The variation in the optical power of the laser as the wavelength is tuned is also high. This is due to the high absorption variation accompanying the index variation related to the electro-optical effect.

One aim of the invention is to propose a laser structure that is tunable across a wide range and very quickly tunable across all of the tuning range, and which features a low level of variation in its optical output power when the operating wavelength is tuned.

There has already been proposed in:

[4] Y. THOMORI et al., "Broad-Range Wavelength-Tunable Superstructure Grating (SSG) DBR Lasers", IEEE Photonics Techn. Lett., Vol. 5, N°6, July 1993, a laser structure having an active section between two Bragg sections with Bragg superstructure gratings, each of which sections is constituted by a succession of ten Bragg gratings with different wavelengths repeated several times. The wavelengths of the different Bragg gratings are spaced periodically.

These superstructure gratings define two combs of reflection peaks as a function of wavelength. The various parameters of these two sections are chosen so that the reflectivity of the various reflection peaks is substantially the same from one peak to another, the periodic spacing between the wavelengths of the reflection peaks being different for the two sections.

The tunability of the laser is achieved by displacement of one of the "combs" relative to the other, or by simultaneous displacement of both "combs", so that the peaks of the combs coincide for only one wavelength.

The displacement of the combs, i.e. the modification of the Bragg wavelength of each of the superstructure gratings, is achieved by modification of the index of the various individual gratings generated by an injection of carriers.

A structure of this kind provides a very wide tuning range.

The switching times are not satisfactory, however.

SUMMARY OF THE INVENTION

The invention consists in a wavelength tunable laser emission component including on the same substrate an active emission section and a Bragg section that includes a waveguide in which is formed a plurality of individual Bragg gratings corresponding to particular Bragg wavelengths, wherein the waveguide has an electro-absorbent structure, the subsections of the Bragg section each being voltage-controlled, the laser emission wavelength being tuned to one or other of the Bragg wavelengths of these subsections according to control voltages applied thereto.

Thus, in accordance with the invention, the absorption variation is used to change the operating wavelength of the laser, instead of the index variation obtained by injection of carriers or application of an electric field (electro-optical effect), as used at present in all the tunable structures previously constructed.

The Bragg sections are preferably such that, with no control voltage applied to the Bragg section, the values of the threshold gain for the various Bragg wavelengths are different, the control voltages applied to these subsections modifying the threshold gain values so that on the curve of the threshold gain as a function of the wavelength the peak for which the threshold gain value is the lowest corresponds to the required emission wavelength.

The Bragg subsections are advantageously such that, with no control voltage applied to the Bragg section, the threshold gain values for the various Bragg wavelengths of the Bragg section are increasing or decreasing over at least one band of wavelengths.

Other features and advantages of the invention will emerge from the following description.

This description is purely illustrative and not limiting on the invention. It must be read with reference to the appended drawings.

DETAILED DESCRIPTION OF THE PREFERRED EMBODIMENT

Figure 1:
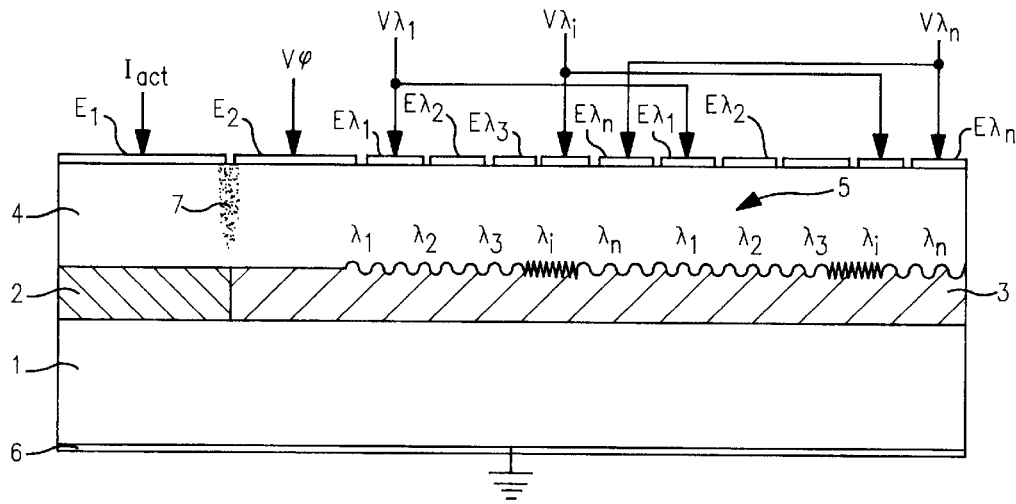
FIG. 1 is a diagrammatic sectional view of one embodiment of a component of the invention.

The components shown in FIG. 1 includes a n-doped InP substrate 1, an active layer 2 deposited on the substrate 1 and an electro-absorbent layer 3 extending the layer 2 on top of the layer 1.

A layer 4 of p-doped InP is then deposited on top of the layers 2 and 3.

A grating that with the layer 4 defines the diffraction grating 5 of the component is etched in the layer 3. The grating 5 comprises a succession of n individual gratings each corresponding to a different Bragg wavelength $\lambda_1$ through $\lambda_n$, this succession of n gratings being repeated several times.

The layer 3 has a portion with no gratings between the layer 2 and the grating 5. This portion defines a phase control section of the component.

The layer 1 carries an electrode 6 connected to the neutral over all of its length.

The layer 4 carries an electrode $E_1$ facing the active layer 2, an electrode $E_2$ facing the portion of the layer 3 that corresponds to the phase section and, for each of the parts of reflection wavelength $\lambda_1 \ldots \lambda_n$ of the Bragg superstructure grating, a respective electrode $E\lambda_1 \ldots E\lambda_n$.

The active layer 2 is controlled by injection of carriers via the electrode $E_1$ corresponding to a current $I_{act}$.

The phase section is controlled by a voltage $V_\phi$.

The various subsections of the Bragg section are voltage-controlled, the control voltage ($V\lambda_i$) being the same for the various subsections that correspond to the same Bragg wavelength $\lambda_i$.

Figure 2A:
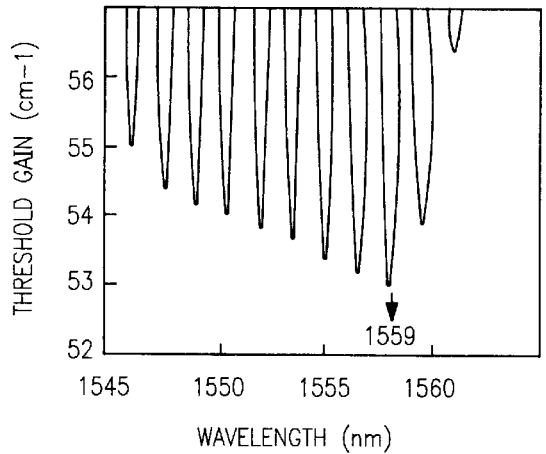
FIGS. 2a, 2b, 2c and 2d are curves of threshold gain as a function of the wavelength respectively obtained without absorption variation (FIG. 2a) and with absorption variation by the Franz-Keldysh effect in the subsections corresponding to the individual gratings with Bragg wavelengths $\lambda_{Bragg}$=1 559 nm (FIG. 2b), $\lambda_{Bragg}$=558 nm (FIG. 2c), $\lambda_{Bragg}$=1 557 nm (FIG. 2d).
Figure 2B:
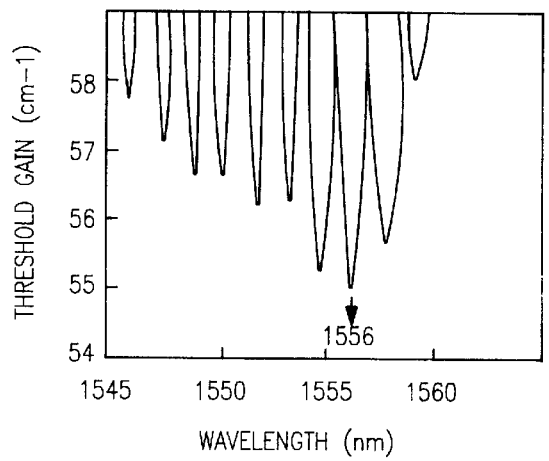

FIG. 2a shows the threshold gain as a function of the wavelength in a FIG. 1 type component when there is no voltage applied to the Bragg section.

It can be seen that the peaks in the threshold gain are not uniform, but define an inclined comb, the threshold gain values of the various peaks decreasing as a function of the wavelength.

The individual gratings of the Bragg section contribute to reflecting the light around the Bragg wavelength to which they correspond. This selective reflection of the light causes a reduction in the threshold gain around the various Bragg wavelengths. The judicious choice of the various parameters of the individual gratings, and in particular the lengths of the various individual gratings corresponding to the same Bragg wavelength, and their coupling coefficient, produces a curve for the threshold gain inclined in the manner of that shown in FIG. 2a.

The laser emission of the component corresponds to the wavelength of the reflection peaks for which the threshold gain is the lowest.

To tune the wavelength of the component, the shape of the threshold gain comb is modified so as to change the wavelength for which the threshold gain is the lowest.

This modification is obtained by acting on the absorption variation of the various subsections of the Bragg section.

A variation of absorption produced in the subsections that correspond to the same Bragg wavelength reduces the reflectivity of those subsections and therefore their contribution to the threshold gain curve: accordingly, the increase in the absorption in the subsections corresponding to the Bragg wavelength $\lambda_i$ causes a reduction in the reflectivity around the Bragg wavelength $\lambda_i$ resulting in an increase in the threshold gain for the threshold gain peaks near $\lambda_i$.

Consequently, the absorption variation of the subsections corresponding to the same Bragg wavelength modifies the position of the peak with the lowest threshold gain and therefore changes the emission wavelength of the component.

It is naturally also possible to modify the emission wavelength by simultaneously varying the absorption of subsections corresponding to different Bragg wavelengths.

To obtain very short switching times (<100 ps) between the various wavelengths, the electro-absorbent material of the layer 3 is advantageously a solid or quantum well semiconductor material enabling electro-absorption by the Franz-Keldysh effect, the Quantum Stark Confinement Effect or the Wannier-Stark effect.

These effects are well known to the person skilled in the art and are used to implement very fast electro-absorbent modulators: modulators of this kind have been made with modulation bandwidths in the order of 42 GHz. Reference may usefully be had to:

[5] F. DEVAUX et al.: "Experimental optimization of MQW electroabsorption modulators towards 40 GHz bandwidths", Electron. Lett., Vol. 30, N°16, August 1994.

The threshold gain curves shown in FIGS. 2a through 2d correspond to a structure that has an active section 1 200 um long, a Bragg section made up of a succession of 19 Bragg subsections repeated three times, the subsections corresponding to the following Bragg wavelengths: 1 530 m, 1 541 nm, 1 545 m, 1 546 nm, 1 547 nm, 1 548 nm, 1 549 nm, 1 550 nm, 1 551 m, 1 552 nm, 1 553 nm, 1 554 nm, 1 555 nm, 1 556 nm, 1 557 nm, 1 558 nm, 1 559 nm, 1 560 nm, 1 602 nm.

With no control voltage applied to the Bragg section, the emission wavelength of the component is 1 559 nm (the lowest peak in the threshold gain curve in FIG. 2a).

If a control voltage is then applied to the subsections that correspond to the Bragg wavelength of 1 559 nm, the threshold gain at the wavelength 1 559 nm increases with the result that the lowest peak of the threshold gain corresponds to the wavelength of 1 556 nm, which becomes the new emission wavelength of the component.

Figure 2C:
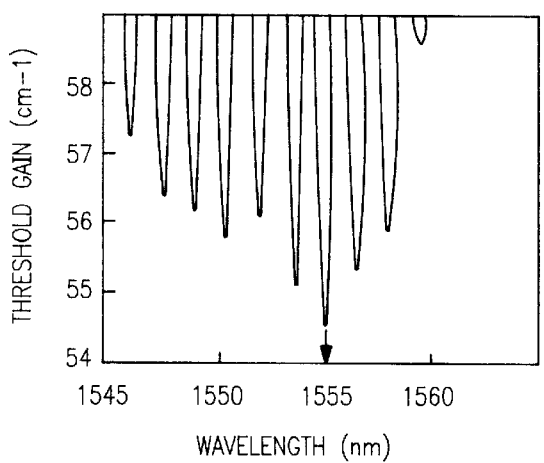
Figure 2D:
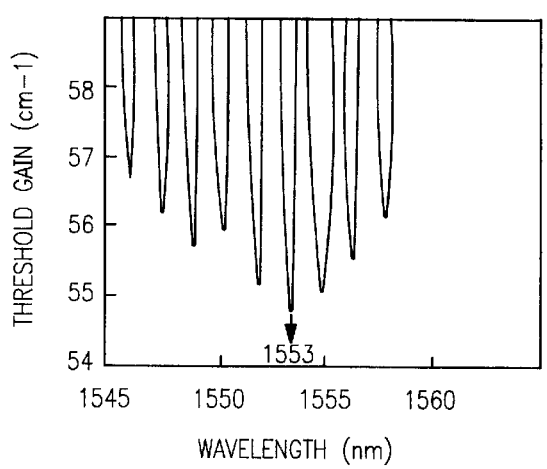

Similarly, as shown in FIGS. 2c and 2d, by applying an absorption control voltage to the subsections corresponding to the Bragg wavelengths of 1 558 nm and 1 557 nm, the emission wavelength of the component is respectively shifted to 1 555 nm and 1 553 nm.

It is therefore possible to tune the component corresponding to the threshold gain curve in FIG. 2a to nine modes spaced by approximately 1.2 nm. A tuning range of 10 nm is therefore accessible, and the switching time from one of these wavelengths to the other is less than 100 ps.

The variation of the output power of a component of this kind as a function of the wavelength remains very low since for each emission wavelength the variation of absorption is limited to some subsections only of the Bragg section and the variation of the threshold gain when the laser is tuned is that imposed by the slope of the comb.

In the embodiment corresponding to FIGS. 2a through 2d, the threshold gain variation is in the order of 2 cm$^{-1}$ for a wavelength excursion of 15 nm over ten modes. By comparison, in the case of a conventional DBR laser with two sections, a 600 μm active section and a 500 μm DBR section with a coupling coefficient of 25 cm$^{-1}$, the threshold gain variation is 10 cm$^{-1}$ for an excursion of 9 nm.

The phase section between the active section and the Bragg section provides fine control of the position of the mode that lases within the lowest threshold gain peak and therefore increases the threshold gain difference between the various possible modes of the DBR-AC laser. Furthermore, this section, the waveguide of which is constituted by the electro-absorbent layer 3, can be used for fast and fine control of the emission wavelength of the laser.

A detailed embodiment of a component similar to that from FIG. 1 will now be described.

A n+InP buffer layer, an active layer 2 designed to provide emission at 1.55 μm, for example, and a p+doped InP protection layer are grown epitaxially in succession onto a n+ doped InP substrate 1.

In a second step the protection layer and the active layer 2 are etched to delimit the active section of the component.

A layered structure extending the active section is then grown by selective epitaxy. It provides a guide that is transparent, at 1.56 μm, for example, and has electro-absorbent properties (Franz-Keldysh effect, Stark effect, Wannier-Stark effect, Braqwet effect, etc) at that wavelength.

As proposed for optical components with a plurality of Bragg gratings in French patent application n° 93 14588 in the name of F. DELORME, this structure advantageously comprises, in addition to the waveguide corresponding to the layer 3, stacks of at least two layers of materials with different optical indexes.

In the case of the Franz-Keldysh effect, the layer 3 is, for example, an InGaAsP layer corresponding to the wavelength of the waveguide, which is 1.47 μm, the stacks implementing the Bragg grating comprising a n-doped InP layer, an InGaAsP layer and a p+ doped InP layer.

The next step is to etch the diffraction gratings onto these stacks through an appropriate mask, protecting the sections with no grating: the active section and the phase section, if present, between the active section and the Bragg section.

The next step is to etch the laser stripe perpendicularly to the lines of the diffraction grating.

Further epitaxial growth then buries the stripe in a p+ InP confinement layer on top of which is a p+ InGaAsP contact layer. A metal contact is formed by successive evaporation of platinum, titanium and gold over all of the surface.

To divide this contact layer into as many electrodes as are required, the ion beam etching (IBE) process is advantageously employed, using ions of argon, for example, with a photosensitive resin mask. This mask delimits the active section, the phase section, if present, and the various subsections constituting the Bragg section by a groove etched in the metal layers, in the InGaAsP contact layer and partially in the p+ doped InP confinement layer ($\approx$0.1 μm).

As shown in FIG. 1 by the barrier 7, the active, forward biased section and the passive phase and Bragg sections are isolated by proton implantation to a width of 10 μm and an appropriate depth in the layer 4.

Further masking is then employed to etch a narrow and deep (3 μm) stripe into the Bragg section (ridge structure). This type of stripe (ridge) provides highly confined waveguide structures, which increases the absorption variation obtained with these waveguides when an electric field is applied. Polyimide is used as the insulator to obtain a very low stray capacitance of the Bragg section, required for fast switching times.

To connect the electrodes of the various subsections of the grating 5 that correspond to the same Bragg wavelength it is necessary to provide metallic interconnections within a three-dimensional space. The multilevel metalization techniques routinely used in the fabrication of integrated electrical circuits on silicon are advantageously used for this (interconnection in a first plane of various contact lands, insulation of the connection lines by a thick dielectric, enabling the other indispensable land connections to be made in a second plane, the connection lines in this plane crossing the lines of the first plane from which they are isolated by the dielectric).

Finally, the metal contact corresponding to the bottom electrode 6 is deposited onto the substrate 1.

There is claimed:

1. A wavelength tunable laser emission component for tuning a laser emission wavelength of the component, the component comprising:

a substrate having an active emission section and a Bragg section divided into a plurality of subsections adapted to receive a control voltage, the Bragg section having a waveguide with an electro-absorbent structure, the waveguide corresponding to particular Bragg wavelengths defining a comb of reflecting peaks; and a first voltage control means for controlling the control voltages of each of the plurality of subsections of the Bragg section wherein the laser emission wavelength is tuned to at least one of the particular Bragg wavelengths according to the control voltages applied thereto.

2. A wavelength tunable laser emission component for tuning a laser emission wavelength of the component, the component comprising:

a substrate having an active emission section and a Bragg section divided into a plurality of subsections adapted to receive a control voltage, the Bragg section having a waveguide with an electro-absorbent structure in which a plurality of individual Bragg gratings are formed so that each of the plurality of individual Bragg gratings corresponds to a particular Bragg wavelength to define a comb of reflecting peaks; and a first voltage control means for controlling the control voltages of each of the plurality of subsections of the Bragg section wherein the laser emission wavelength is tuned to at least one of the particular Bragg wavelengths according to the control voltages applied thereto.

3. The component as claimed in claim 2, wherein each of the plurality of individual Bragg gratings has a threshold gain value that is different with respect to all of the other plurality of individual Bragg gratings for a particular control voltage and further wherein the gain value of each of the plurality of individual Bragg gratings is susceptible to varying control voltage, whereby the laser emission wavelength is tuned to the Bragg wavelength corresponding to the Bragg grating with the lowest threshold gain value according to the control voltages applied thereto.

4. The component as claimed in claim 3, wherein light is generated in the active emission section and the plurality of individual Bragg gratings have varying threshold gain values over at least one band of wavelengths if no control voltage is applied to the Bragg section as light is generated in the active emission section.

5. The component as claimed in claim 4 further comprising at least one of fiber optic transmission structure and optical switching structure.

6. The component as claimed in claim 2 wherein the electro-absorbent structure is of a quantum well type and the first voltage control means is adapted to apply the control voltages to the electro-absorbent structure, thereby commanding electro-absorption by a Wannier-Stark effect.

7. The component as claimed in claim 2 further comprising:
   a phase section having an electro-absorbent waveguide with no grating disposed between the active emission section and the Bragg section;
   a second voltage means for voltage controlling the phase section for accurate control of the laser emission wavelength.

8. The component as claimed in claim 7 wherein the phase section is of an electro-absorbent structure that is the same as that of the Bragg section.

9. The component as claimed in claim 2 wherein the electro-absorbent structure is a bulk semiconductor material type and the first voltage control means is adapted to apply the control voltages to the electro-absorbent structure, thereby commanding electro-absorption by a Franz-Keldysh effect.

10. The component as claimed in claim 2 wherein the electro-absorbent structure is a quantum well type and the first voltage control means is adapted to apply control voltages to the electro-absorbent structure, thereby commanding electro-absorption by a Quantum Stark Confinement effect.

11. The component as claimed in claim 2, the plurality of subsections having a Bragg grating pattern that repeats several times throughout the plurality of subsections wherein Bragg gratings within the Bragg grating pattern that correspond to the same wavelength are controlled by a same control voltage through the first voltage control means.

12. The component as claimed in claim 2, the electro-absorbent structure having a waveguide layer of InGaAsP.

* * * * *